US009552803B2

(12) United States Patent
Innami et al.

(10) Patent No.: US 9,552,803 B2
(45) Date of Patent: Jan. 24, 2017

(54) COMMUNICATION METHOD, COMMUNICATION SYSTEM, AND MAGNETIC RESONANCE APPARATUS

(71) Applicant: GE MEDICAL SYSTEMS GLOBAL TECHNOLOGY COMPANY, LLC, Waukesha, WI (US)

(72) Inventors: Yasuyuki Innami, Tokyo (JP); Kiyoshi Murakami, Tokyo (JP); Shohei Kimoto, Tokyo (JP); Yuya Mizobe, Tokyo (JP); Yusuke Asaba, Tokyo (JP)

(73) Assignee: General Electric Company, Schenectady, NY (US)

( * ) Notice: Subject to any disclaimer, the term of this patent is extended or adjusted under 35 U.S.C. 154(b) by 756 days.

(21) Appl. No.: 13/717,189

(22) Filed: Dec. 17, 2012

(65) Prior Publication Data

US 2013/0163771 A1 Jun. 27, 2013
US 2014/0072131 A9 Mar. 13, 2014

(30) Foreign Application Priority Data

Dec. 21, 2011 (JP) ................................ 2011-279324

(51) Int. Cl.
*H03B 29/00* (2006.01)
*G10K 11/16* (2006.01)
*H04R 3/00* (2006.01)

(52) U.S. Cl.
CPC ................. *G10K 11/16* (2013.01); *H04R 3/00* (2013.01); *H04R 2410/03* (2013.01)

(58) Field of Classification Search
CPC .... H04R 2225/55; H04R 25/554; H04R 3/002
USPC ... 381/71.1, 71.2, 71.11, 107, 318; 704/226, 704/227; 600/25
See application file for complete search history.

(56) References Cited

U.S. PATENT DOCUMENTS 4,696,030 A 9/1987 Egozi
4,981,137 A 1/1991 Kondo et al.
5,877,732 A 3/1999 Ziarati
8,085,942 B2 12/2011 Rasmussen
2003/0071624 A1 4/2003 Schwarz
2005/0119882 A1 * 6/2005 Bou-Ghazale ................ 704/227
2005/0197565 A1 9/2005 Yagi et al.
(Continued)

FOREIGN PATENT DOCUMENTS

CN 1411783 A 4/2003
CN 1856974 A 11/2006
(Continued)

OTHER PUBLICATIONS

CN OA for Application No. 201210308791.5 with English Translation. Office Action dated Feb. 15, 2016, 15 pages.

*Primary Examiner* — Md S Elahee

(57) ABSTRACT

A communication method is provided. The communication method includes generating a pseudo background sound signal based on a gradient pulse control signal, performing a computation of subtracting the pseudo background sound signal from an acoustic signal having a sound signal and a background sound signal including a gradient coil drive sound signal, the acoustic signal obtained by an input device configured to receive the voice of a subject, and outputting sound based on a result of the computation, wherein a parameter of generating the pseudo background sound signal is controlled to reduce the difference resulting from the subtraction.

18 Claims, 3 Drawing Sheets

(56) References Cited

U.S. PATENT DOCUMENTS

| | | | |
|---|---|---|---|
| 2007/0081584 | A1 | 4/2007 | Alessandro |
| 2008/0132750 | A1* | 6/2008 | Miller ............................ 600/25 |
| 2011/0142250 | A1 | 6/2011 | Schmale et al. |
| 2014/0119572 | A1* | 5/2014 | Gao ...................... G10L 19/167<br>381/107 |

FOREIGN PATENT DOCUMENTS

| | | | |
|---|---|---|---|
| CN | 102119339 | A | 7/2011 |
| CN | 102175889 | A | 9/2011 |
| JP | H046889 | A | 1/1992 |
| JP | 2000333931 | | 5/2000 |
| JP | 2000-333931 | | 12/2000 |
| JP | 2003116817 | | 4/2003 |
| JP | 2003317409 | | 11/2003 |
| JP | 2010268188 | | 11/2010 |

* cited by examiner

COMMUNICATION METHOD, COMMUNICATION SYSTEM, AND MAGNETIC RESONANCE APPARATUS

CROSS REFERENCE TO RELATED APPLICATIONS

This application claims the benefit of Japanese Patent Application No. 2011-279324 filed Dec. 21, 2011, which is hereby incorporated by reference in its entirety.

BACKGROUND OF THE INVENTION

The present invention relates to a communication method, a communication system, and a magnetic resonance apparatus for transmitting voice of a subject to an operator of a magnetic resonance apparatus.

Conventionally, in a magnetic resonance apparatus typified by an MRI (Magnetic Resonance Imaging) apparatus, there is provided a communication system including a means that generates a pseudo background sound signal in accordance with a gradient pulse control signal, and a means that subtracts the pseudo background sound signal from an acoustic signal which is taken by an input means such as a microphone, and a means that outputs sound on the basis of the computation result (refer to, for example, Japanese Patent No. 4,162,329, FIGS. 1 and 4, and the like). The communication system is also called an inter-com. system.

In the communication system, sound in which background sound including gradient coil drive sound generated at the time of driving a gradient coil is suppressed by a gradient pulse control signal can be output, and it enables the operator to clearly catch the voice of the subject.

Although further concrete configurations in the communication method can be variously considered, the background sound suppression effect largely differs depending on the method of generating a pseudo background sound signal. Since the environment in an examination room may change with lapse of time, optimum conditions for generating the pseudo background sound signal are not always the same.

However, a more concrete configuration by which a higher background sound suppression effect can be expected in the communication method has not been proposed yet.

Under such circumstances, a proposal is in demand, on a configuration by which a higher background sound suppression effect can be expected in the communication method of generating a pseudo background sound signal in accordance with a gradient pulse control signal and subtracting the signal from an input acoustic signal, thereby extracting a sound signal.

BRIEF DESCRIPTION OF THE INVENTION

In a first aspect, a communication method is provided. The communication method is a method of performing computation of subtracting a pseudo background sound signal generated on the basis of a gradient pulse control signal from an acoustic signal having a sound signal and a background sound signal including a gradient coil drive sound signal, obtained from an input device for taking voice of a subject and outputting sound on the basis of a result of the computation, wherein a parameter of generating the pseudo background sound signal is controlled so as to reduce the difference resulted from the subtraction.

In a second aspect, a communication system is provided. The communication system includes an input device for taking voice of a subject, a generation device for generating a pseudo background sound signal on the basis of a gradient pulse control signal, a computation device for performing computation of subtracting the pseudo background sound signal from an acoustic signal having a sound signal and a background sound signal including a gradient coil drive sound signal, obtained by the input device, a control device for controlling a parameter for generating the pseudo background sound signal in the generation device so as to reduce the difference resulted from the subtraction, and an output device for outputting sound on the basis of a result of the computation.

In a third aspect, the communication system of the second aspect is provided, in which the generation device includes an adaptive digital filter, and the control is performed by using an adaptive algorithm.

In a fourth aspect, the communication system of the third aspect is provided, in which the adaptive digital filter is an FIR (Finite Impulse Response) filter or an IIR (Infinite Impulse Response) filter.

In a fifth aspect, the communication system from the third or fourth aspect is provided, in which the adaptive algorithm is an LMS (Least Mean Square) algorithm or an RLS (Recursive Least Square) algorithm.

In a sixth aspect, the communication system from any one of the third to fifth aspects is provided, in which the gradient pulse control signal is a signal expressing waveform of current supplied to a gradient coil.

In a seventh aspect, the communication system from the sixth aspect is provided, in which the adaptive digital filter receives the current waveform.

In an eighth aspect, the communication system from the sixth aspect is provided, in which the adaptive digital filter receives differentiated waveform of the current waveform.

In a ninth aspect, the communication system from any one of the second to eighth aspects is provided, in which the input device is a microphone disposed in an examination room, and the output device is a speaker (speaker unit) disposed on the outside of the examination room.

In a tenth aspect, a magnetic resonance apparatus having a communication system is provided. The magnetic resonance apparatus includes an input device for taking voice of a subject, a generation device for generating a pseudo background sound signal on the basis of a gradient pulse control signal, a computation device for performing computation of subtracting the pseudo background sound signal from an acoustic signal having a sound signal and a background sound signal including a gradient coil drive sound signal, obtained by the input device, a control device for controlling a parameter for generating the pseudo background sound signal in the generation device so as to reduce the difference resulted from the subtraction, and an output device for outputting sound on the basis of a result of the computation.

In an eleventh aspect, the magnetic resonance apparatus from the tenth aspect is provided, in which the generation device includes an adaptive digital filter, and the control is performed by using an adaptive algorithm.

In a twelfth aspect, the magnetic resonance apparatus from the eleventh aspect is provided, in which the adaptive digital filter is an FIR (Finite Impulse Response) filter or an IIR (Infinite Impulse Response) filter.

In a thirteenth aspect, the magnetic resonance apparatus from the eleventh or twelfth aspect is provided, in which the adaptive algorithm is an LMS (Least Mean Square) algorithm or an RLS (Recursive Least Square) algorithm.

In a fourteenth aspect, the magnetic resonance apparatus from any one of the eleventh to thirteenth aspects is provided, in which the gradient pulse control signal is a signal expressing waveform of current supplied to a gradient coil.

In a fifteenth aspect, the magnetic resonance apparatus from the fourteenth aspect is provided, in which the adaptive digital filter receives the current waveform.

In a sixteenth aspect, the magnetic resonance apparatus from the fourteenth aspect is provided, in which the adaptive digital filter receives differentiated waveform of the current waveform.

According to the above aspects, a parameter or generating a pseudo background sound signal is controlled so as to reduce the difference resulted when the pseudo background sound signal generated on the basis of a gradient pulse control signal is subtracted from an acoustic signal having a sound signal and a background sound signal, which is supplied. Therefore, the generation parameter is always optimized, a background sound component in an input signal can be suppressed with precision, and a higher background sound suppression effect can be expected.

DETAILED DESCRIPTION OF THE INVENTION

Hereinafter, exemplary embodiments will be described. The disclosure is not limited to the embodiments specifically described herein.

First Embodiment

Figure 1:
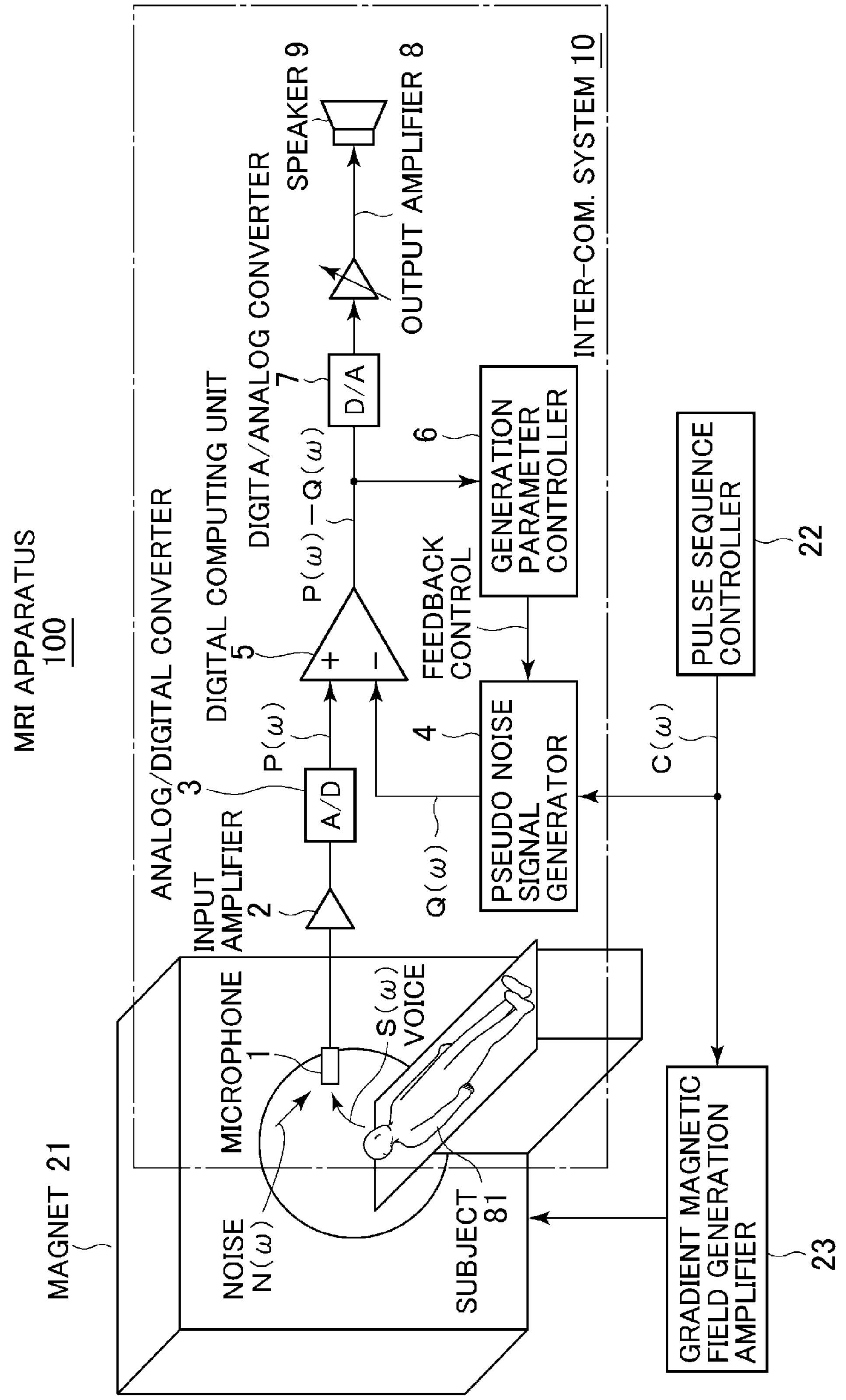
FIG. 1 is a diagram showing an exemplary inter-com. system and an exemplary MRI apparatus according to a first embodiment.

FIG. 1 shows an exemplary inter-com. system (communication system) and an exemplary MRI apparatus according to a first embodiment.

An inter-com. system 10 has a microphone (the input device) 1 for taking voice S(ω) of a subject 81, an input amplifier 2 for amplifying an output signal of the microphone 1 and outputting an acoustic signal P(ω), an analog/digital converter 3 for converting an analog output of the input amplifier 2 to digital data, a pseudo noise signal generator (the generating device) 4 for generating digital data of a pseudo noise signal (pseudo background sound signal) Q(ω) on the basis of a gradient pulse control signal C(ω) for generating a gradient magnetic field, a digital computing unit (the computing device) 5 for performing computation of subtracting the digital data of the pseudo noise signal Q(ω) from the digital data of the acoustic signal P(ω) which is output from the analog/digital converter 3, a generation parameter controller (the control device) 6 for controlling a parameter for generating the pseudo noise signal in the pseudo noise signal generator 4 to decrease the difference P(ω)−Q(ω) resulted from the subtraction, a digital/analog converter 7 for converting digital data P(ω)−Q(ω) which is output from the digital computing unit 5 to an analog signal, an output amplifier 8 for amplifying an output signal of the digital/analog converter 7, and a speaker (the output device) 9 for outputting sound from an output signal of the output amplifier 8.

In mounting, the pseudo noise signal generator 4, the digital computing unit 5, and the generation parameter controller 6 are realized by, for example, a digital signal processing circuit (DSP).

An MRI apparatus 100 includes a magnet 21 having therein a gradient coil, a pulse sequence controller 22 outputting a gradient pulse control signal C(ω), a gradient magnetic field amplifier 23 driving the gradient coil by the gradient pulse control signal C(ω) to generate a gradient magnetic field, and the inter-com. system 10. Noise N(ω) occurs due to vibrations generated when the gradient coil is driven.

The microphone 1 is mounted in the bore of the magnet 21. The input amplifier 2 to the speaker 9 is mounted in a console disposed in an operator room which is different from a scan room (examination room) in which the magnet 21 is disposed.

Figure 2:
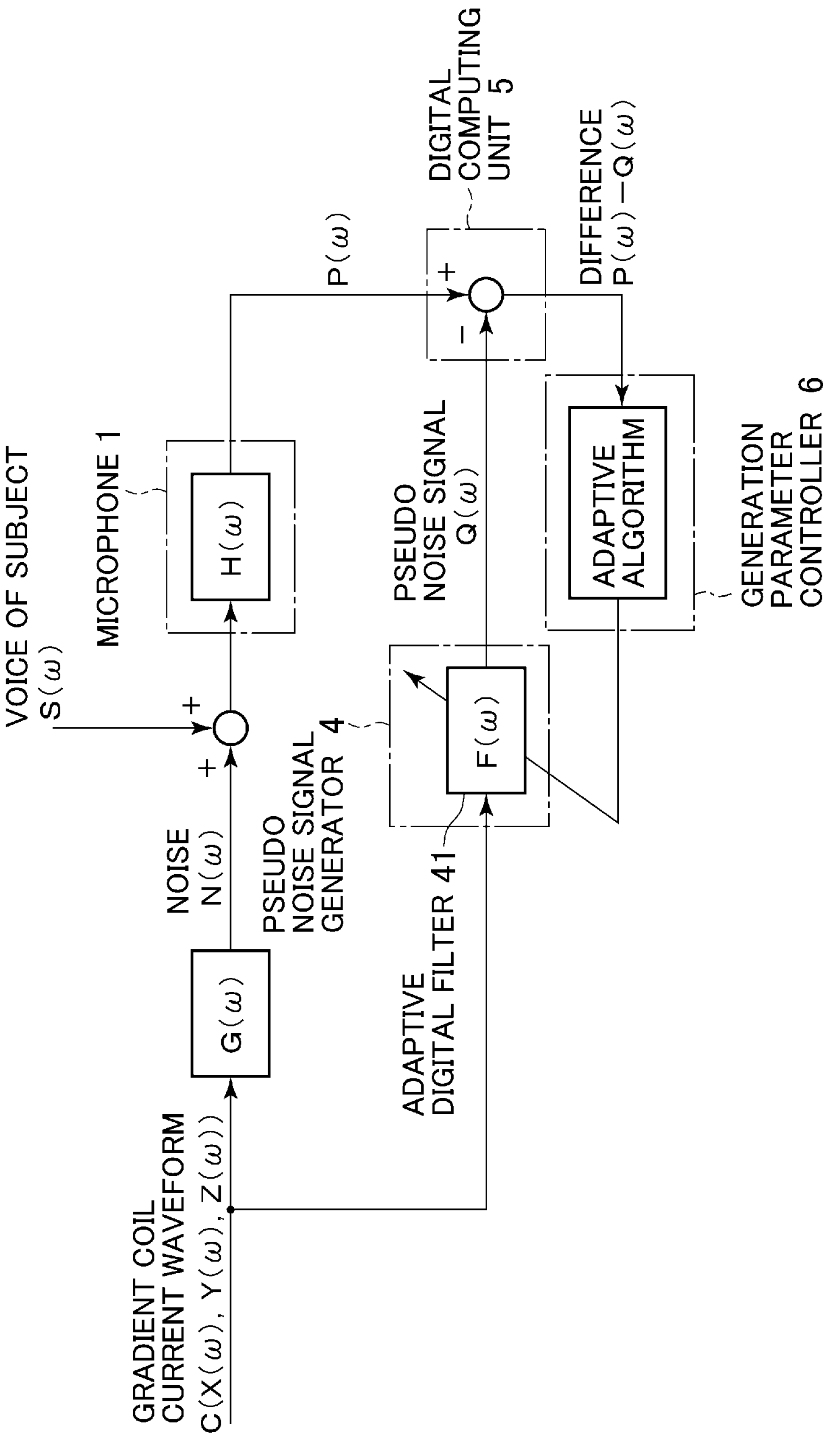
FIG. 2 is a block diagram of an exemplary noise suppressing process in the first embodiment.

FIG. 2 is a block diagram of an exemplary noise suppressing process in the first embodiment.

In FIG. 2, the microphone 1 detects the sound S(ω) of the subject 81 and also detects noise (background sound) N(ω) which occurs due to vibrations of the gradient coil, and the sounds are transmitted at a transfer function H(ω) to the speaker 9 side. At this time, the noise N(ω) is determined by the gradient pulse control signal C(ω). The gradient pulse control signal C(ω) is, in this case, current waveform C(X(ω), Y(ω), Z(ω)) applied to gradient coils in the X-axis, Y-axis, and Z-axis. The current waveform C(ω) is a waveform obtained by combining current waveforms of the three axes. The transfer function from the current waveform C(ω) at this time to the noise N(ω) is expressed as G(ω). The transfer function G(ω) is not constant at each of time points and fluctuates according to the environment and other factors.

Consequently, the acoustic signal P(ω) transmitted to the speaker 8 side can be expressed by the following formula given by Equation 1.

$$
\begin{aligned}
P(\omega) &= \{S(\omega) + N(\omega)\} \cdot H(\omega) = \\
&\{S(\omega) + C(X(\omega), Y(\omega), Z(\omega)) \cdot G(\omega)\} \cdot H(\omega) = \\
&S(\omega) \cdot H(\omega) + C(X(\omega), Y(\omega), Z(\omega)) \cdot G(\omega) \cdot H(\omega)
\end{aligned}
\qquad \text{Equation 1}
$$

where the first term of the right side of the formula corresponds to the sound signal, and the second term corresponds to the noise signal.

The pseudo noise signal generator 4 includes an adaptive digital filter 41 having a function F(ω). The current waveform C(X(ω), Y(ω), Z(ω)) applied to the gradient coil is supplied to the adaptive digital filter 41. In the adaptive digital filter 41, a pseudo noise signal Q(ω)=C(X(ω), Y(ω), Z(ω))·F(ω) is generated. The digital computing unit 5 performs a process of subtracting the pseudo noise signal Q(ω) from the acoustic signal P(ω). The generation parameter controller 6 feedback-controls a parameter for generating the pseudo noise signal in the pseudo noise signal generator 4 so as to reduce the difference P(ω)−Q(ω) obtained when the pseudo noise signal Q(ω) is subtracted from the acoustic signal P(ω).

Since the adaptive digital filter 41 generates a pseudo noise signal derived from the current waveform, the pseudo noise signal Q(ω) does not include the sound signal $S(\omega)\cdot H(\omega)$. Consequently, when the feedback control is performed, the pseudo noise signal $Q(\omega)$ is approximately converged to the noise signal as the second term of the right side of the formula of Equation 1, and the adaptive digital filter 41 is optimized to a filter of $F(\omega)=G(\omega)\cdot H(\omega)$. As a result, the digital computing unit 5 can extract only the sound signal $S(\omega)\cdot H(\omega)$ and output it.

An output of the digital computing unit 5 is transmitted to the speaker 9 via the digital/analog converter 7 and the output amplifier 8. As a result, only the sound $S(\omega)$ is output from the speaker 9.

The adaptive digital filter 41 is, for example, an FIR filter, and an adaptive algorithm used in the generation parameter controller 6 is, for example, an LMS algorithm by the least square method. Each of coefficients bi of the FIR filter receiving the current waveform $C(X(\omega), Y(\omega), Z(\omega))$ which is applied to the gradient coil are continuously updated so that the square of the difference $P(\omega)-Q(\omega)$ becomes the minimum by the LMS algorithm.

As described above, according to the first embodiment, the parameter for generating the pseudo noise signal is controlled so as to reduce the difference obtained by subtracting the pseudo noise signal generated on the basis of the gradient pulse control signal from the acoustic signal of input sound+noise. Consequently, the generation parameter is always optimized, a noise component in the input signal can be suppressed with high precision, and a high noise suppression effect can be expected.

Second Embodiment

Figure 3:
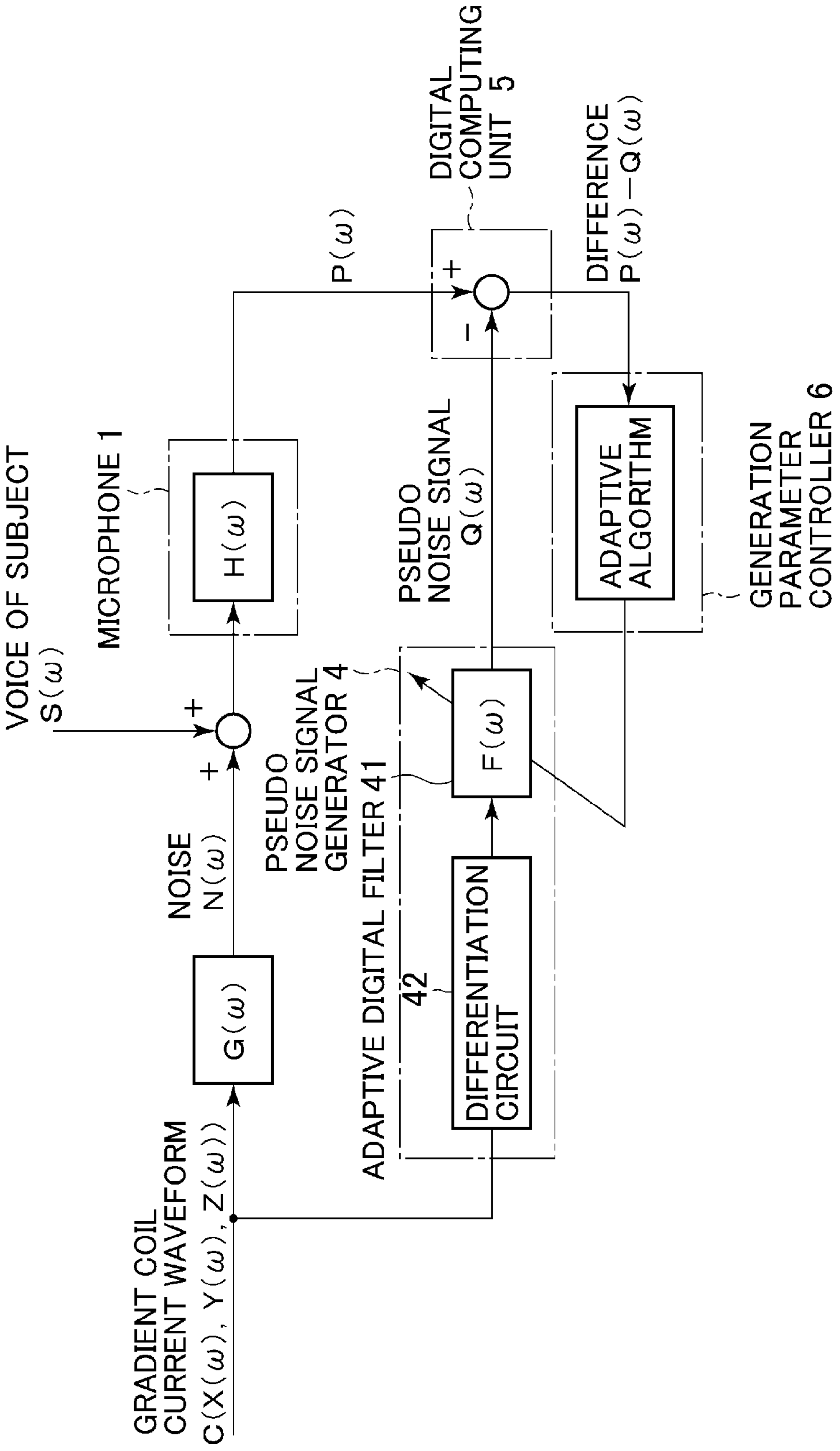
FIG. 3 is a block diagram of an exemplary noise suppressing process in a second embodiment.

FIG. 3 is a block diagram of an exemplary noise suppressing process in a second embodiment.

In the second embodiment, as shown in FIG. 3, the pseudo noise signal generator 4 includes a differentiation circuit 42 and the adaptive digital filter 41. The current waveform $C(X(\omega), Y(\omega), Z(\omega))$ applied to the gradient coil is first supplied to the differentiation circuit 42 and a differentiation waveform $C'(\omega)$ of the current waveform is output. The differentiation waveform $C'(\omega)$ of the current waveform is input to the adaptive digital filter 41. The other configuration is the same as that of the first embodiment.

It can be said that the differentiation waveform $C'(\omega)$ of the current waveform is a waveform expressing the magnitude of a change in the current waveform. On the other hand, there is tendency that the larger a change in the current waveform is, the larger noise which occurs at the time of driving the gradient coil is generated as large sound. Consequently, when the differentiation waveform $C'(\omega)$ of the current waveform is input to the adaptive digital filter 41, generation of a pseudo noise signal close to actual noise can be expected.

When the differentiation waveform $C'(\omega)$ of the current waveform is input to the adaptive digital filter 41, a pseudo noise signal $Q(\omega)=C'(X(\omega), Y(\omega), Z(\omega))\cdot F(\omega)$ is generated. The digital computing unit 5 performs a process of subtracting the pseudo noise signal $Q(\omega)$ from the acoustic signal $P(\omega)$. The generation parameter controller 6 feedback-controls a parameter for generating the pseudo noise signal in the pseudo noise signal generator 4 so as to reduce the output of the digital computing unit 5, that is, the difference $P(\omega)-Q(\omega)$ obtained when the pseudo noise signal $Q(\omega)$ is subtracted from the acoustic signal $P(\omega)$.

Since the adaptive digital filter 41 generates a pseudo noise signal derived from the differentiation waveform of the current waveform, the pseudo noise signal $Q(\omega)$ does not include the sound signal $S(\omega)\cdot H(\omega)$ and, in addition, there is the possibility that the pseudo noise signal $Q(\omega)$ is closer to actual noise. Consequently, when the feedback control is performed, the pseudo noise signal $Q(\omega)$ is approximately converged to the noise signal as the second term of the right side of the formula of Equation 1 with higher precision, and the adaptive digital filter can be optimized to a filter of $F(\omega)=G(\omega)\cdot H(\omega)$. As a result, it is expected that the digital computing unit 5 can extract only the sound signal $S(\omega)\cdot H(\omega)$ with high precision and output it.

As described above, according to the second embodiment, the differentiation waveform of the current waveform supplied to the gradient coil is supplied to the adaptive digital filter and a pseudo noise signal is generated. Consequently, generation of the pseudo noise signal close to actual noise can be expected and it can be expected to extract only the sound signal with higher precision and output it.

The adaptive digital filter 41 may be another filter such as an IIR filter. The above-described adaptive algorithm may be another algorithm such as RLS algorithm by the recursive least-square method.

The invention claimed is:

1. A communication method comprising:

generating a pseudo background sound signal by an adaptive filter based on a gradient pulse control signal;

performing a computation of subtracting the pseudo background sound signal from an acoustic signal having a sound signal and a background sound signal including a gradient coil drive sound signal, the acoustic signal obtained by an input device configured to receive a voice of a subject as the sound signal; and outputting an output sound signal based on a result of the computation, wherein a parameter for generating the pseudo background sound signal is controlled using the output sound signal as feedback using an adaptive algorithm to reduce a difference resulting from the subtraction.

2. A communication system comprising:

an input device configured to receive a sound signal including a voice of a subject;

an adaptive filter configured to generate a pseudo background sound signal based on a gradient pulse control signal;

a computation device configured to perform a computation of subtracting the pseudo background sound signal from an acoustic signal having the sound signal and a background sound signal including a gradient coil drive sound signal, the acoustic signal obtained by the input device;

a control device configured to control a parameter for generating the pseudo background sound signal in the generation device to reduce a difference resulting from the subtraction; and an output device configured to output an output sound signal based on a result of the computation, wherein the output sound signal is used as feedback by the control device to control the parameter using an adaptive algorithm.

3. The communication system according to claim 2, wherein the adaptive digital filter is an FIR (Finite Impulse Response) filter.

4. The communication system according to claim 2, wherein the adaptive digital filter is an IIR (Infinite Impulse Response) filter.

5. The communication system according to claim 2, wherein the adaptive algorithm is an LMS (Least Mean Square) algorithm.

6. The communication system according to claim 2, wherein the adaptive algorithm is an RLS (Recursive Least Square) algorithm.

7. The communication system according to claim 2, wherein the gradient pulse control signal is a signal expressing a waveform of a current supplied to a gradient coil.

8. The communication system according to claim 7, wherein the adaptive digital filter is configured to receive the current waveform.

9. The communication system according to claim 7, wherein the adaptive digital filter is configured to receive a differentiated waveform of the current waveform.

10. The communication system according to claim 2, wherein the input device is a microphone located in an examination room, and wherein the output device is a speaker located outside of the examination room.

11. A magnetic resonance apparatus having a communication system-comprising:

an input device configured to receive a voice of a subject as a sound signal;

an adaptive filter configured to generate a pseudo background sound signal based on a gradient pulse control signal;

a computation device configured to perform a computation of subtracting the pseudo background sound signal from an acoustic signal having the sound signal and a background sound signal including a gradient coil drive sound signal, the acoustic signal obtained by the input device;

a control device configured to control a parameter for generating the pseudo background sound signal in the generation device to reduce a difference resulting from the subtraction; and an output device configured to output an output sound signal based on a result of the computation, wherein the output sound signal is used as feedback by the control device to control the parameter using an adaptive algorithm.

12. The magnetic resonance apparatus according to claim 11, wherein the adaptive digital filter is an FIR (Finite Impulse Response) filter.

13. The magnetic resonance apparatus according to claim 11, wherein the adaptive digital filter is an IIR (Infinite Impulse Response) filter.

14. The magnetic resonance apparatus according to claim 11, wherein the adaptive algorithm is an LMS (Least Mean Square) algorithm.

15. The magnetic resonance apparatus according to claim 11, wherein the adaptive algorithm is an RLS (Recursive Least Square) algorithm.

16. The magnetic resonance apparatus according to claim 11, wherein the gradient pulse control signal is a signal expressing a waveform of a current supplied to a gradient coil.

17. The magnetic resonance apparatus according to claim 16, wherein the adaptive digital filter is configured to receive the current waveform.

18. The magnetic resonance apparatus according to claim 16, wherein the adaptive digital filter is configured to receive a differentiated waveform of the current waveform.

* * * * *